United States Patent
Yamamoto

(10) Patent No.: US 11,640,119 B2
(45) Date of Patent: May 2, 2023

(54) EXPOSURE METHOD, EXPOSURE APPARATUS, ARTICLE MANUFACTURING METHOD, AND METHOD OF MANUFACTURING SEMICONDUCTOR DEVICE

(71) Applicant: CANON KABUSHIKI KAISHA, Tokyo (JP)

(72) Inventor: Tetsuya Yamamoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 242 days.

(21) Appl. No.: 17/018,768

(22) Filed: Sep. 11, 2020

(65) Prior Publication Data

US 2021/0088781 A1    Mar. 25, 2021

(30) Foreign Application Priority Data

Sep. 19, 2019   (JP) .............................. JP2019-170804

(51) Int. Cl.
*G03F 7/20* (2006.01)
(52) U.S. Cl.
CPC .......... *G03F 7/70891* (2013.01); *G03F 7/706* (2013.01); *G03F 7/70258* (2013.01)
(58) Field of Classification Search
CPC .. G03F 7/70891; G03F 7/70258; G03F 7/706; G03F 7/70308; G03F 7/70433; G02B 7/028; H01L 21/027
See application file for complete search history.

(56) References Cited

U.S. PATENT DOCUMENTS

| | | | | |
|---|---|---|---|---|
| 5,424,552 A | * | 6/1995 | Tsuji | ................... G03F 7/70241 250/548 |
| 7,602,473 B2 | * | 10/2009 | Nakauchi | ................ G03F 7/702 362/268 |
| 7,817,249 B2 | * | 10/2010 | Uehara | ................ G03F 7/70891 355/70 |

FOREIGN PATENT DOCUMENTS

| JP | 5266641 B2 | 8/2013 |
|---|---|---|
| WO | 2006025408 A1 | 3/2006 |

* cited by examiner

*Primary Examiner* — Hung V Nguyen
(74) *Attorney, Agent, or Firm* — Rossi, Kimms & McDowell LLP

(57) ABSTRACT

An exposure method of performing an exposure operation of exposing a substrate via a projection optical system is provided. The method includes executing, in an exposure period in which the exposure operation is performed, aberration correction of the projection optical system to correct an aberration generated by performing the exposure operation, measuring, in a non-exposure period succeeding the exposure period, in which the exposure operation is not performed, an aberration of the projection optical system, and correcting the aberration of the projection optical system using a correction amount adjusted based on a result of the measurement so as to reduce a correction residual in the aberration correction of the projection optical system.

12 Claims, 10 Drawing Sheets

EXPOSURE METHOD, EXPOSURE APPARATUS, ARTICLE MANUFACTURING METHOD, AND METHOD OF MANUFACTURING SEMICONDUCTOR DEVICE

BACKGROUND OF THE INVENTION

Field of the Invention

The present invention relates to an exposure method, an exposure apparatus, an article manufacturing method, and a method of manufacturing a semiconductor device.

Description of the Related Art

In the manufacturing of an article such as a semiconductor device or the like, an exposure apparatus that illuminates an original (a reticle or a mask) by an illumination optical system, projects a pattern of the original onto a substrate via a projection optical system, and exposes the substrate is used. Since the imaging characteristic of a projection optical system changes depending on an exposure light irradiation operation, the imaging characteristic can be corrected in the exposure apparatus by controlling the position and posture of an optical element. Aberration components that can be corrected by controlling the position and posture of an optical element are limited, and a rotationally asymmetric imaging characteristic such as astigmatism cannot be corrected.

Japanese Patent No. 5266641 discloses a method in which the amount of astigmatism generated by absorbing the heat of a light beam is measured in advance, and the aberration amount is corrected while estimating it based on the measurement result.

However, the temporal fluctuation amount of the aberration generation can change depending on a difference in reticle shape, exposure condition, or the like, in addition to the exposure light. Accordingly, if the aberration amounts are measured under all exposure conditions and the correction amount is determined based on the data, the high correction accuracy can be obtained. However, this is difficult in practical apparatus operation. Therefore, when the correction amount obtained by pre-measurement is used as in conventional cases, the correction residuals are accumulated along with a long-term operation.

SUMMARY OF THE INVENTION

The present invention provides a technique advantageous in maintaining the high correction accuracy of a projection optical system for a long period of time.

The present invention in its one aspect provides an exposure method of performing an exposure operation of exposing a substrate via a projection optical system, the method comprising executing, in an exposure period in which the exposure operation is performed, aberration correction of the projection optical system to correct an aberration generated by performing the exposure operation, measuring, in a non-exposure period succeeding the exposure period, in which the exposure operation is not performed, an aberration of the projection optical system, and correcting the aberration of the projection optical system using a correction amount adjusted based on a result of the measurement so as to reduce a correction residual in the aberration correction of the projection optical system.

Further features of the present invention will become apparent from the following description of exemplary embodiments (with reference to the attached drawings).

DESCRIPTION OF THE EMBODIMENTS

Figure 1:
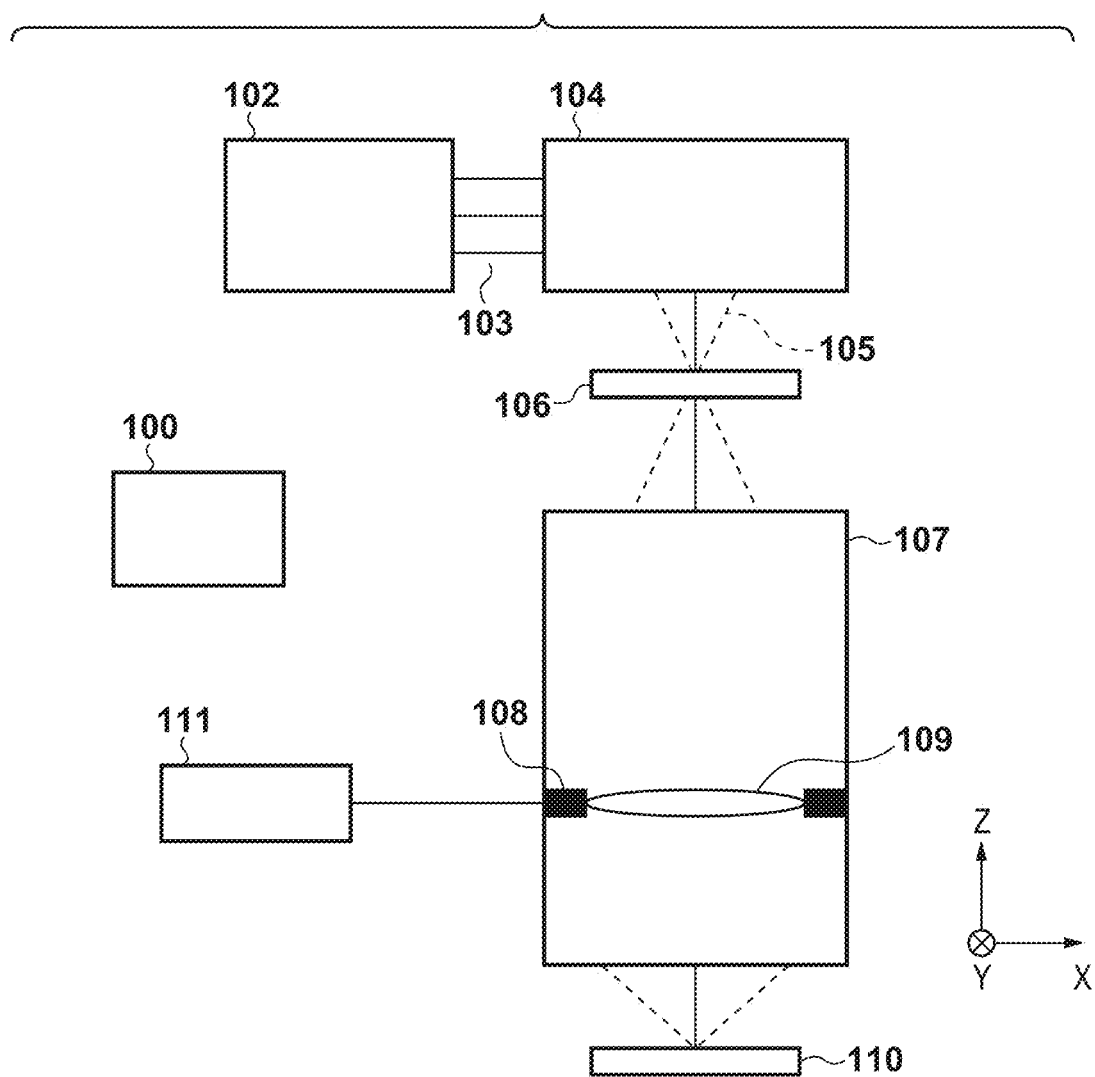
FIG. 1 is a view showing the arrangement of an exposure apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a view showing the arrangement of an exposure apparatus according to an embodiment. The exposure apparatus schematically performs an exposure operation of exposing a substrate 110 via a projection optical system 107. In this specification and the drawings, directions are indicated based on an XYZ coordinate system in which a plane parallel to a surface on which the substrate 110 is arranged is set as an X-Y plane, as shown in FIG. 1. The exposure apparatus includes a light source 102, an illumination optical system 104, the projection optical system 107, a controller 100, and a temperature controller 111. In an exposure operation, the illumination optical system 104 illuminates an original 106 with light (exposure light) from the light source 102, and the pattern of the original 106 is projected onto the substrate 110 by the projection optical system 107 to expose the substrate 110. The exposure apparatus may be formed as an exposure apparatus that exposes the substrate 110 in a state in which the original 106 and the substrate 110 are stopped still or as an exposure apparatus that exposes the substrate 110 while scanning the original 106 and the substrate 110. In general, the substrate 110 includes a plurality of shot regions, and an exposure operation is performed on each shot region.

The light source 102 can include, for example, an excimer laser, but can also include another light-emitting device. The excimer laser can generate, for example, light having a wavelength of 248 nm or 193 nm, but light of another wavelength can also be generated. The projection optical system 107 can include an optical element 109 and a temperature regulator 108 that controls the temperature distribution on the optical element 109. The temperature regulator 108 can reduce the change in the optical characteristic of the projection optical system 107 by applying thermal energy to the optical element 109 to change the refractive index distribution and/or the surface shape of the optical element 109. The thermal energy applied to the optical element 109 by the temperature regulator 108 can include positive energy and negative energy. Application of positive energy to the optical element 109 represents heating of the optical element 109, and application of negative energy to the optical element 109 represents cooling of the optical element 109.

The temperature regulator 108 may be arranged to be tightly adhered to the optical element 109, and the thermal energy transmission between the temperature regulator 108 and the optical element 109 will be efficient in such a case. Alternatively, the temperature regulator 108 may be arranged spaced apart from the optical element 109. This arrangement is advantageous in the point that a mechanical force will not be applied to the optical element 109 by the temperature regulator 108, and in the point that the temperature regulator 108 will not damage the optical element 109 by scratching or the like.

It is preferable to arrange the temperature regulator 108 outside the effective diameter (optical path) of the optical element 109 so the temperature regulator 108 will not block the light irradiation to the substrate 110. For example, the temperature regulator 108 can be arranged on the outer edge portion of a lens serving as the optical element 109, the front surface of the lens, or the back surface of the lens. Alternatively, the temperature regulator 108 may be arranged inside the effective diameter in a range that will not influence the optical performance of the projection optical system 107. As an example of such an arrangement, for example, a thin heating wire may be arranged in the effective diameter of the optical element or a heat transmitting element which has a high light transmittance may be arranged in the effective diameter of the optical element.

In a case in which the temperature regulator 108 is to be arranged on the outer periphery of the optical element 109, the optical element 109 can be arranged at or near a pupil plane of the projection optical system 107. Note that the temperature regulator 108 may be arranged on the optical element arranged at a position spaced apart from the pupil plane of the projection optical system 107. The temperature controller 111 controls the temperature regulator 108. The temperature controller 111 can control the amount of thermal energy applied to the optical element 109 and the continuation time of the application, and the temperature distribution on the optical element 109 can be controlled as a result. Information required for control by the temperature controller 111 is obtained by measuring, in advance, the aberration generation amount of the optical element 109 upon being applied with heat under the exposure condition to be executed. The controller 100 determines, based on the information obtained by the measurement, the thermal energy to be applied to the optical element 109 at the time of exposure, and gives an instruction including the information to the temperature controller 111. The temperature controller 111 applies the thermal energy to the temperature controller 108 using a control value (current amount) corresponding to the given instruction.

The controller 100 can control the light source 102, the illumination optical system 104, the projection optical system 107, and the temperature controller 111. The controller 100 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components.

Figure 2A:
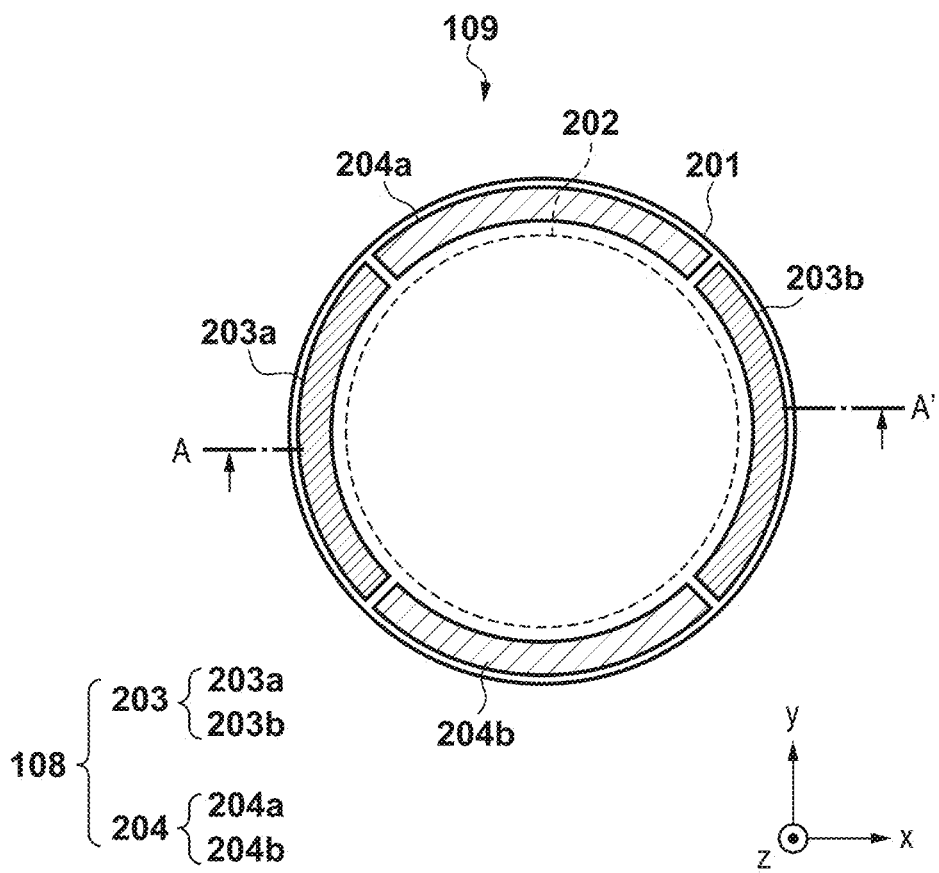
FIGS. 2A and 2B are views showing the arrangement of an optical element and a temperature regulator in the embodiment.
Figure 2B:
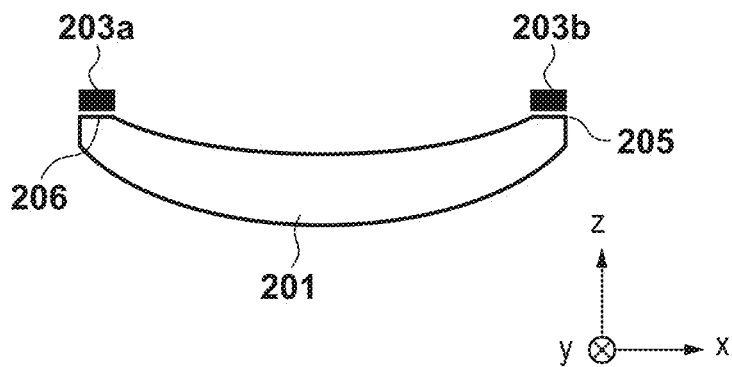

FIGS. 2A and 2B are views showing an arrangement example of the optical element 109 and the temperature regulator 108. FIG. 2A is a plan view of the optical element 109 when viewed from above in the Z direction, and FIG. 2B is a sectional view taken along a line A-A' shown in FIG. 2A. The optical element 109 can include a lens 201. The temperature regulator 108 can include a first temperature regulator 203 and a second temperature regulator 204. The first temperature regulator 203 can include a heater element 203a and a heater element 203b, and the second temperature regulator 204 can include a heater element 204a and a heater element 204b.

A circle 202 drawn with a broken line represents the light beam effective diameter of the lens 201. Outside the light beam effective diameter, the heater element 203a and the heater element 203b are arranged at positions facing each other along the Y direction with the center of the lens 201 interposed therebetween, and the heater element 204a and the heater element 204b are arranged at positions facing each other along the X direction with the center of the lens 201 interposed therebetween. Each of the heater elements 203a, 203b, 204a, and 204b can have an arc shape corresponding to a length of one quarter of the circumference of the lens 201. Each of the heater elements 203a, 203b, 204a, and 204b can be formed by, for example, a flexible cable including a heating wire, and heat is generated by applying a current to the heating wire, so that a temperature distribution can be generated in the lens 201.

As shown in FIG. 2B, the heater elements 203a, 203b, 204a, and 204b can be arranged on the planar portion of the lens 201 so as to be spaced apart therefrom by 10 to 100 μm. The heat of each of the heater elements 203a, 203b, 204a, and 204b can be transferred to the lens 201 via a medium 205 between each of the heater elements 203a, 203b, 204a, and 204b and the lens 201, respectively. The medium 205 can be, for example, a gas such as air or nitrogen. Alternatively, the heater elements 203a, 203b, 204a, and 204b need not face the lens 201 via the medium 205, and each of the heater elements 203a, 203b, 204a, and 204b may have, for example, a structure in which metal having high thermal conductivity sandwiches the heating wire.

In the example shown in FIG. 2B, the heater elements 204a, 204b, 203a, and 203b are arranged on the planar portion (on the side of the illumination optical system 104) of the lens 201. However, the heater elements 204a, 204b, 203a, and 203b may be arranged below (on the side of the substrate 110) the lens 201 or on the outer edge portion of the lens 201. The lens 201 can include a heated surface 206 which is heated by the heater elements 204a, 204b, 203a, and 203b. The heated surface 206 may be flat or curved. The heated surface 206 can be, for example, a roughened surface (a surface in the manner of frosted glass).

Figure 3A:
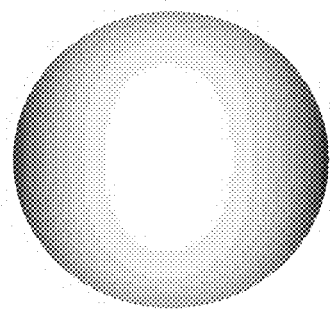
FIGS. 3A and 3B are views each showing the temperature distribution on a lens heated by the temperature regulator.
Figure 3B:
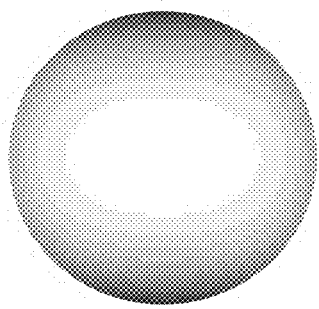

FIG. 3A exemplifies the temperature distribution on the lens 201 that has been heated by the second temperature controller 204. At this time, astigmatism is generated on the surface of the substrate 110 in the positive direction. FIG. 3B exemplifies the temperature distribution on the lens 201 heated by the first temperature controller 203. The temperature distribution shown in FIG. 3B is a temperature distribution that has the opposite phase of the temperature distribution shown in FIG. 3A. The temperature distribution shown in FIG. 3B generates astigmatism on the surface of the substrate 110 in the negative direction. In this manner, positive and negative astigmatisms can be generated by heating of the lens 201 by the second temperature controller 204 and the first temperature controller 203. Compared to an arrangement in which the positive astigmatism and the negative astigmatism are generated by a combination of heating and cooling by using an element such as a Peltier element, this kind of arrangement is advantageous in that the arrangement of the temperature regulator 108 can be simplified.

Figure 4:
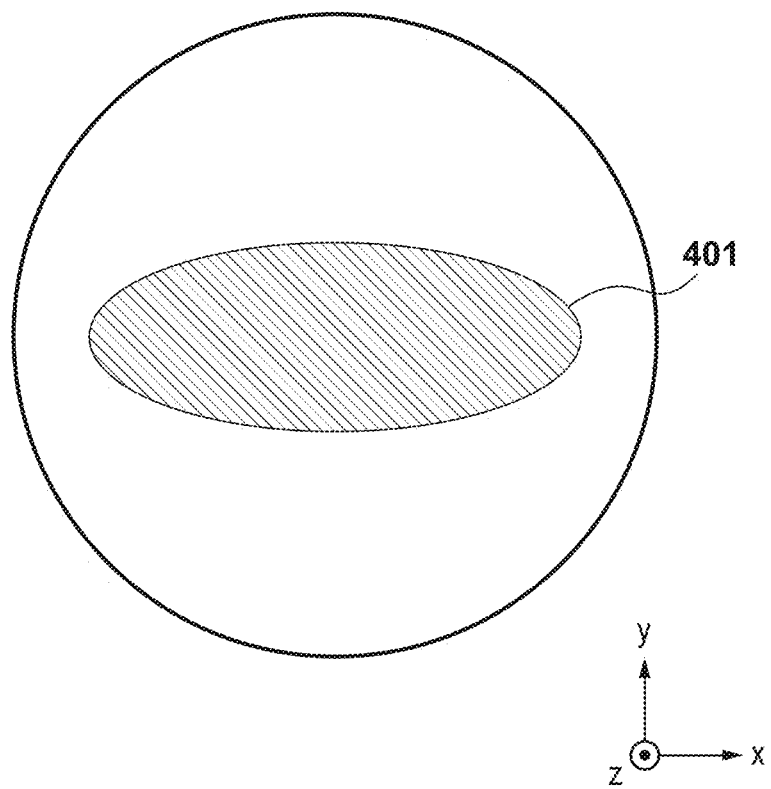
FIG. 4 is a view showing the intensity distribution of a light beam that passes through a projection optical system of a scanning exposure apparatus.

Here, consider a scanning exposure apparatus that scans the original 106 and the substrate 110 with respect to a long slit-shaped light beam (exposure light) in the X direction. In this case, the intensity distribution of the light beam that passes through the projection optical system 107 at the time of the exposure operation is as shown by a hatched portion 401 of FIG. 4. Here, the temperature distribution on the lens 201 (the optical element 109) generated by the absorption of the light beam will differ in the X direction and the Y direction. This can cause a large amount of astigmatism to be generated in the projection optical system 107.

Hence, a temperature distribution can be applied to the lens 201 by the temperature regulator 108 so as to reduce this amount of astigmatism. The astigmatism generated by the temperature regulator 108 and the astigmatism generated when the lens 201 absorbs a light beam have opposite signs. Therefore, the astigmatism generated by the absorption of the light beam by the lens 201 can be reduced (corrected) by the astigmatism generated by the temperature regulator 108. Note that the temporal characteristic of the change of the astigmatism generated by the temperature regulator 108 may be different from the temporal characteristic of the change of the astigmatism generated by the absorption of the light beam. In this case, by controlling the temperature distribution by controlling the current applied to the heating wire of each of the heater elements 203a, 203b, 204a, and 204b, it is possible to change the temporal characteristic of the astigmatism and execute correction with high accuracy.

Figure 5:
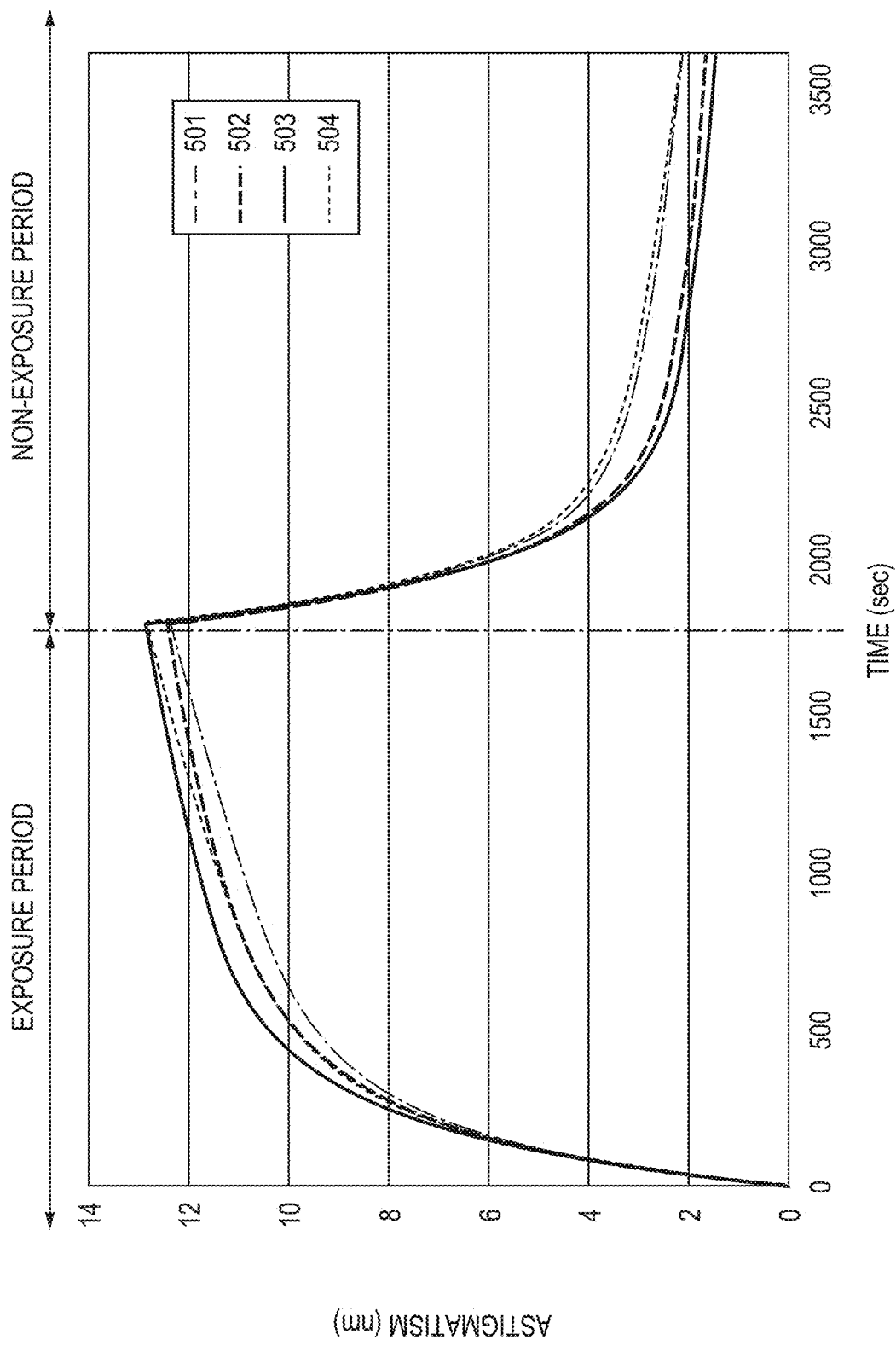
FIG. 5 is a graph showing the temporal characteristic of astigmatism.

FIG. 5 is a graph showing the temporal characteristic of astigmatism. In FIG. 5, the "exposure period" refers to a period including an exposure operation, and the "non-exposure period" refers to a period succeeding the "exposure period", in which the exposure operation is not performed. In the first example, the exposure period can be a period of a series of exposure operations for one lot (for example, 25 substrates), and the non-exposure period can be a period from the end of the exposure operation for the last substrate in the lot to the start of the exposure operation for the first substrate in the next lot. In this case, the exposure period includes each period between shots in which no exposure is performed in practice, and each substrate replacement period. If a change in aberration during such a substrate replacement period can be ignored, the first example can be applied. In the second example, the exposure period can be a period of a series of exposure operations for a plurality of shot regions on one substrate, and the non-exposure period can be a period (substrate replacement period) from the end of the last exposure operation on the substrate to the start of the exposure operation on the next substrate. The second example is suitable for a case in which a change in aberration in the substrate replacement period cannot be ignored. In the third example, the exposure period can be a period of an exposure operation on one shot region, and the non-exposure period can be a period (shot moving period) from the end of the exposure operation on the shot region to the start of the exposure operation on the next shot region. The third example is suitable for a case in which a change in aberration in the shot moving period cannot be ignored. The first to third examples are different from each other in the number of exposure operations in one set, but can be understood as a common idea in the following description.

A characteristic 501 indicates that the astigmatism increases due to heat input from the exposure light during the exposure period, and the astigmatism decreases due to heat dissipation during the non-exposure period. In order to correct such astigmatism, it is ideal to generate astigmatism having a temporal characteristic symmetrical to the characteristic 501 with respect to the time axis by heating the lens by the temperature regulator 108.

However, the characteristic 501 is an example under a certain exposure condition, and if the exposure condition (the illumination mode, the reticle transmittance, the angle of view, or the like) changes, this characteristic can change to a characteristic 502, 503, or 504, or the like. Therefore, the temporal characteristics of astigmatism are measured in advance under some exposure conditions (for example, characteristic data represented by the curves 501 to 504 are obtained), each measurement result data is stored in the memory of the controller 100, and correction is executed using the stored data. However, it is not realistic from the viewpoint of obtainment time and storage data capacity to obtain the data in advance under all exposure conditions to use it. Therefore, the astigmatism is corrected using the measurement result obtained in advance under the exposure condition close to the exposure condition at the time of exposure.

Figure 6:
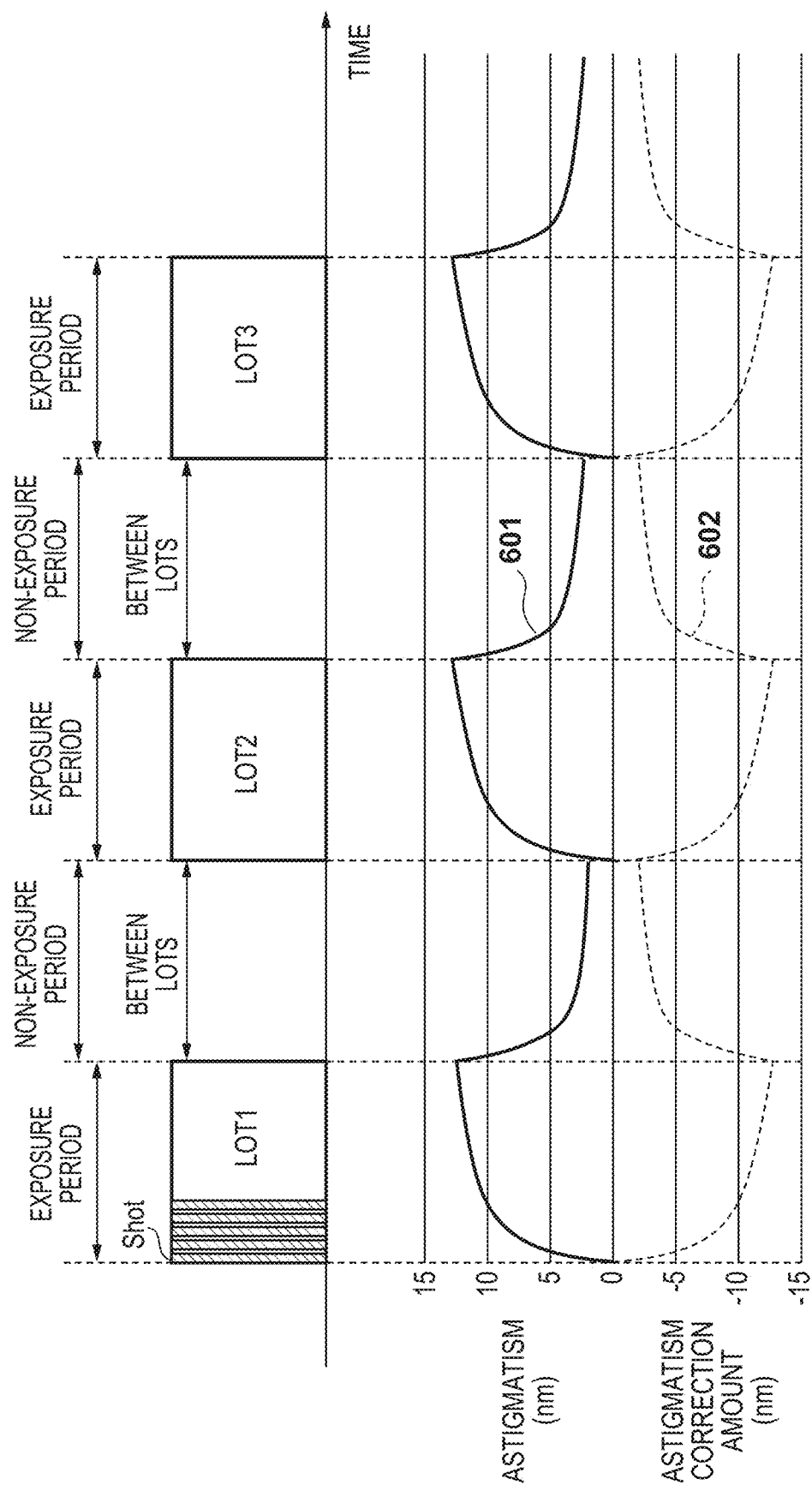
FIG. 6 is a view showing the temporal characteristic of an astigmatism correction amount.

As shown in FIG. 6, the controller 100 determines, from the premeasured data (data of one of the characteristics 501 to 504), an astigmatism correction amount 602 that cancels an astigmatism characteristic 601. Then, the controller 100 gives an instruction of the current amount required to generate the correction amount to the temperature controller 111, and the temperature regulator 108 executes astigmatism correction.

Figure 7:
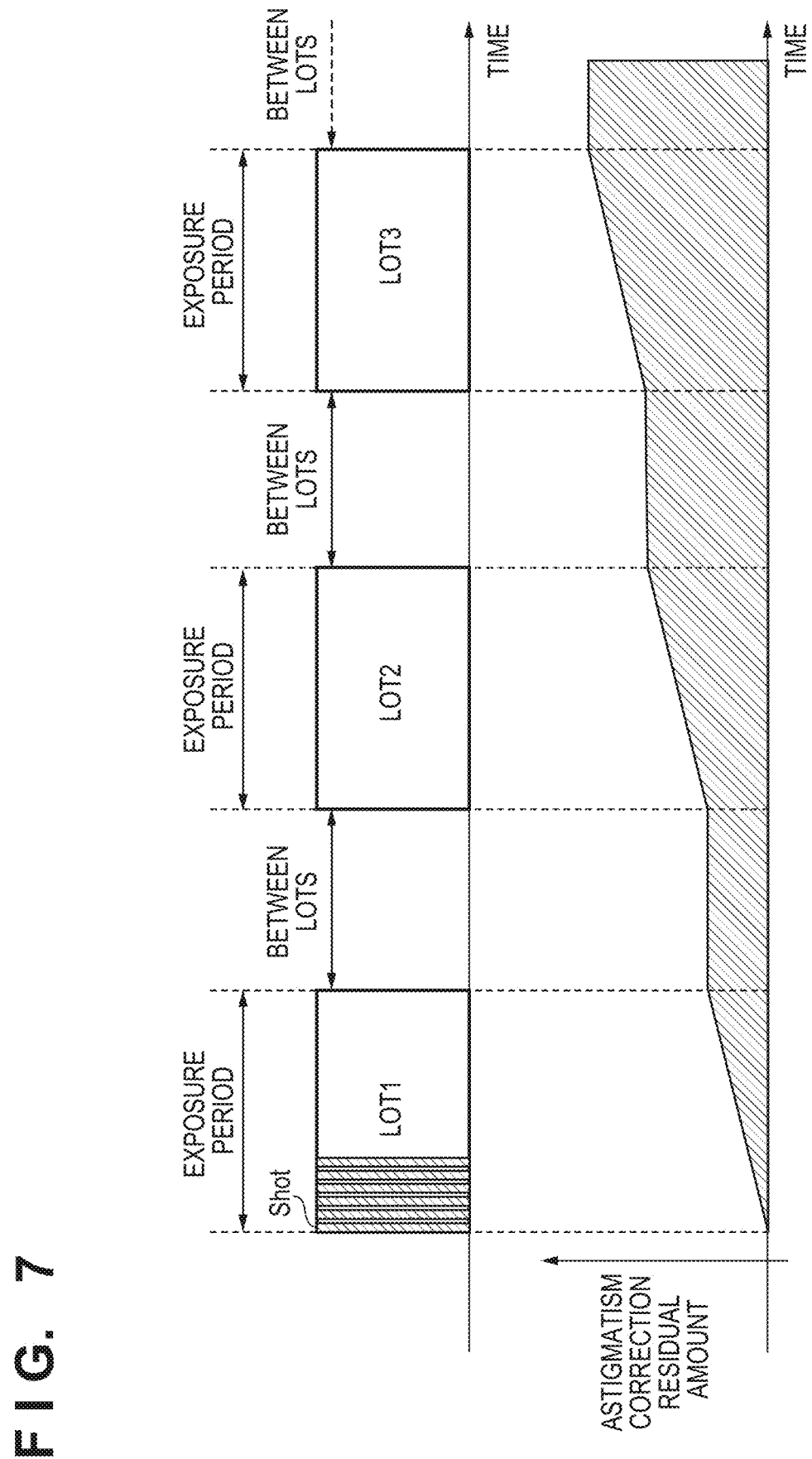
FIG. 7 is a view for explaining accumulation of astigmatism correction residuals.

However, when the exposure condition is not completely the same as that of the premeasured data (data of one of the characteristics 501 to 504), the astigmatism correction residual is generated. As shown in FIG. 7, the correction residual is accumulated every exposure (shot) in the exposure period. Such an exposure residual accumulated amount needs to be reduced.

Figure 8:
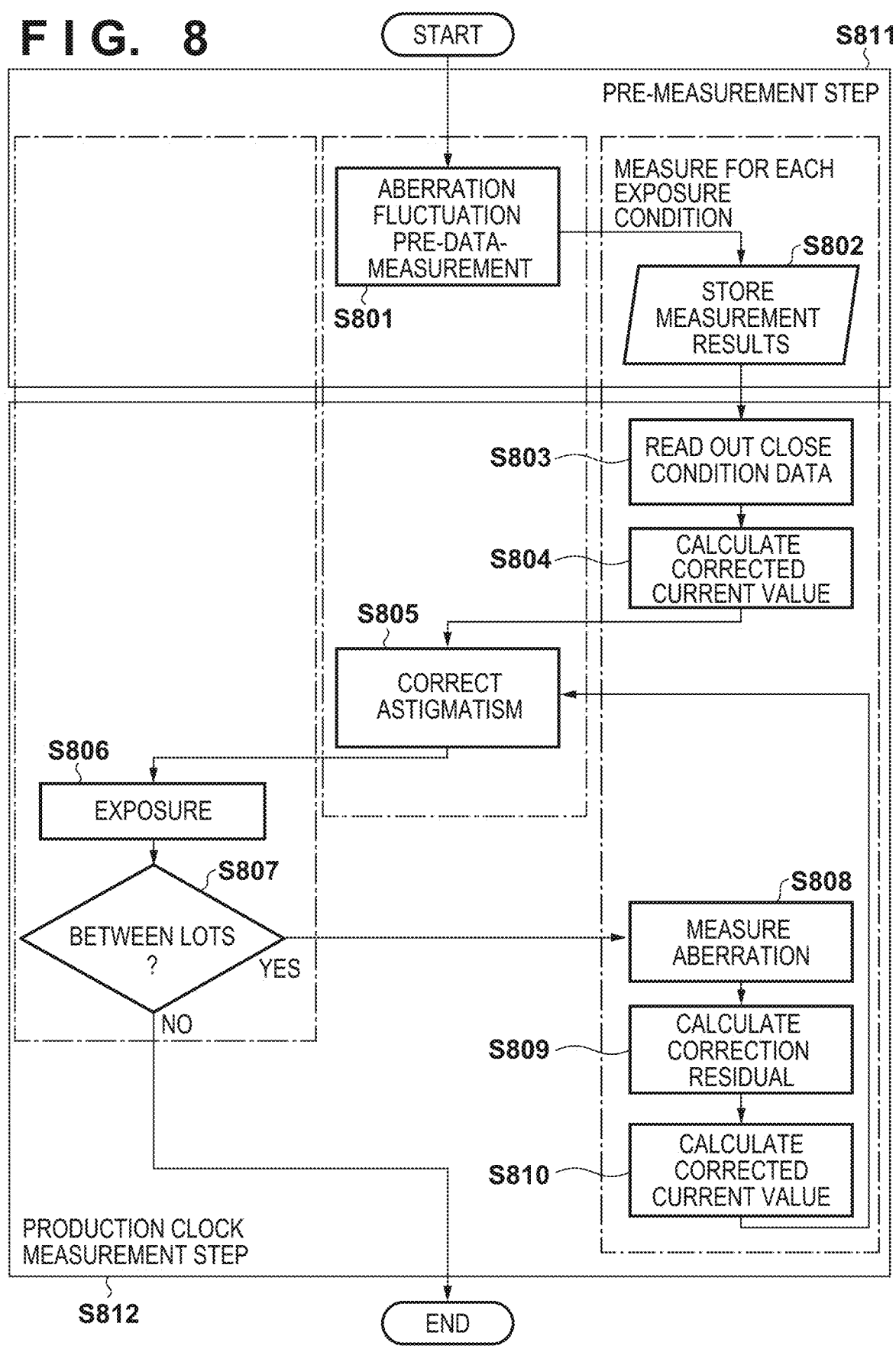
FIG. 8 is a flowchart illustrating astigmatism correction processing in the embodiment.

FIG. 8 is a flowchart illustrating astigmatism correction processing in this embodiment. The correction processing includes pre-measurement step S811 that is executed, for example, at the initial stage of installation of the exposure apparatus, and production measurement step S812 that is executed at the time of device production (exposure).

Pre-measurement step S811 is a step (the first step) of measuring the aberration of the projection optical system 107 in advance. In pre-measurement step S811, the controller 100 first measures the characteristic of astigmatism under each of a plurality of exposure conditions in step S801. In step S802, the controller 100 stores the characteristic data obtained by the measurement in the memory.

In production measurement step S812, the controller 100 selects and acquires the characteristic data obtained under the exposure condition close to the currently set exposure condition (the exposure condition applied to the exposure operation) from the memory in step S803. In step S804, the controller 100 determines the aberration correction amount from the acquired characteristic data. The controller 100 calculates current values to be applied to the heating elements 203a, 203b, 204a, and 204b corresponding to the determined correction amount, and informs the temperature controller 111 of the calculated current values as an instruction value. In step S805, the temperature controller 111 controls the currents applied to the heating wires of the heating elements 203a, 203b, 204a, and 204b in accordance with the instruction value, thereby executing the astigmatism correction (the second step).

After the state of the lens 201 is adjusted by this correction, the controller 100 performs an exposure operation (lot processing) in step S806. When the lot processing is completed, the controller 100 determines in step S807 whether there is a lot to be processed next (that is, whether it is between lot processing operations). If there is a lot to be processed next, the process advances to step S808. If there is no lot to be processed next, the process is terminated.

Figure 11:
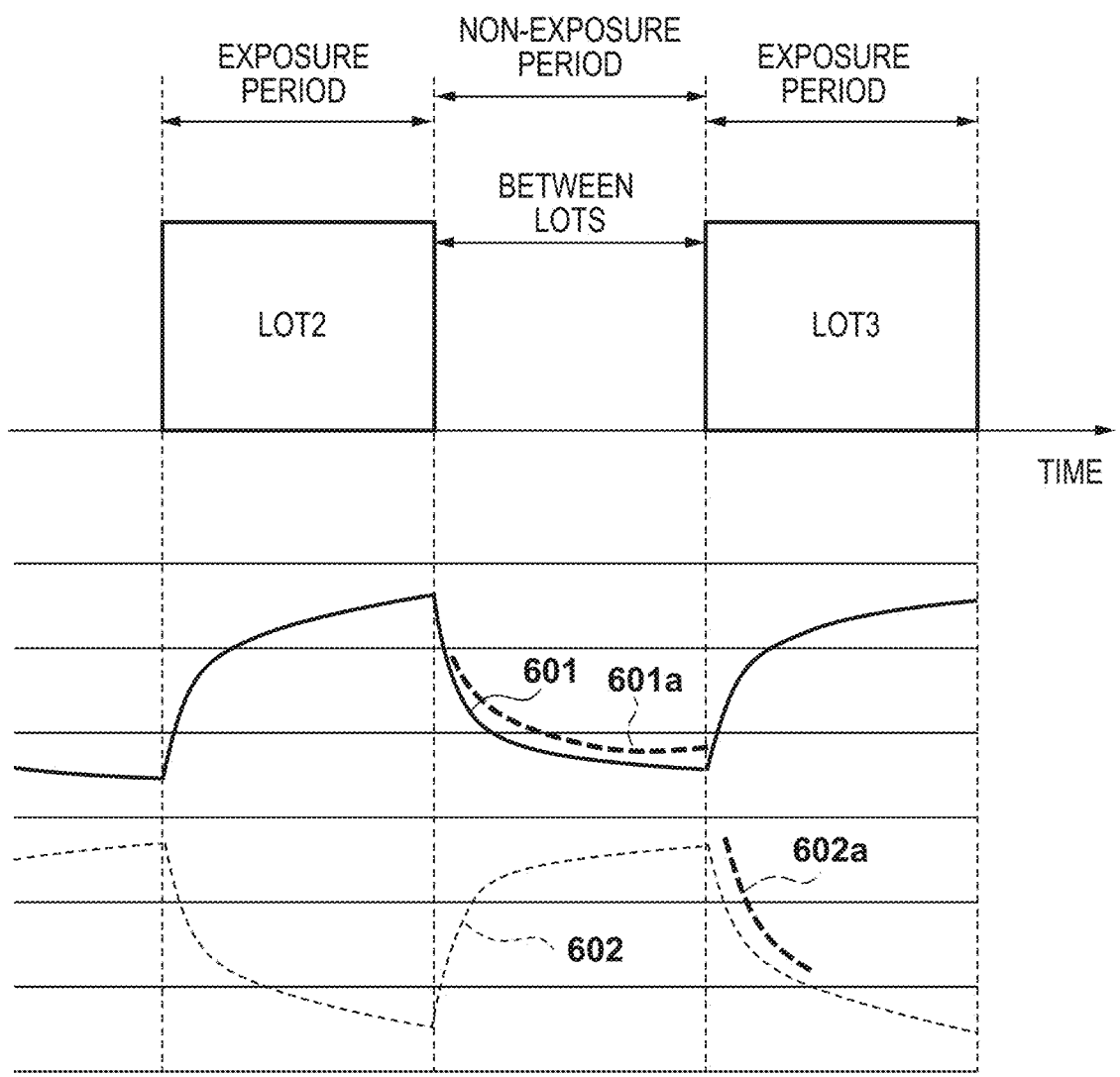
FIG. 11 is a view for explaining astigmatism fluctuation along with the operation of the exposure apparatus.

Steps S808 to S810 are processing executed in the non-exposure period. In step S808, the controller 100 measures the characteristic of astigmatism (the third step). The characteristic data obtained by this measurement reflects the actual characteristic of astigmatism at the current time. FIG. 11 is an enlarged view showing a portion including the non-exposure period and the exposure periods before and after the non-exposure period shown in FIG. 6. In FIG. 11, a characteristic 601 represented by a solid line indicates the characteristic data acquired in step S803 (that is, the characteristic data obtained by the pre-measurement). On the other hand, a characteristic 601a represented by a broken line indicates the characteristic data obtained by the measurement in step S808. As can be seen, the characteristic of astigmatism has fluctuated from that at the time of pre-measurement along with the operation of the exposure apparatus.

Therefore, in step S809, the controller 100 calculates the correction residual by calculating the difference between the characteristic data acquired in step S803 and the characteristic data obtained in step S808. In step S810, the controller 100 adjusts the correction amount so as to reduce the correction residual (the fourth step). The controller 100 calculates current values to be applied to the heating elements 203a, 203b, 204a, and 204b corresponding to the adjusted correction amount, and informs the temperature controller 111 of the calculated current values as an instruction value. This instruction value reflects the correction amount in the next exposure period. A characteristic 602a indicates an example of the characteristic of the correction amount in which the correction amount is obtained by adjusting the correction amount in the preceding exposure period. In step S805, the temperature controller 111 controls the currents applied to the heating wires of the heating elements 203a, 203b, 204a, and 204b in accordance with the instruction value, thereby executing the astigmatism correction.

Figure 10:
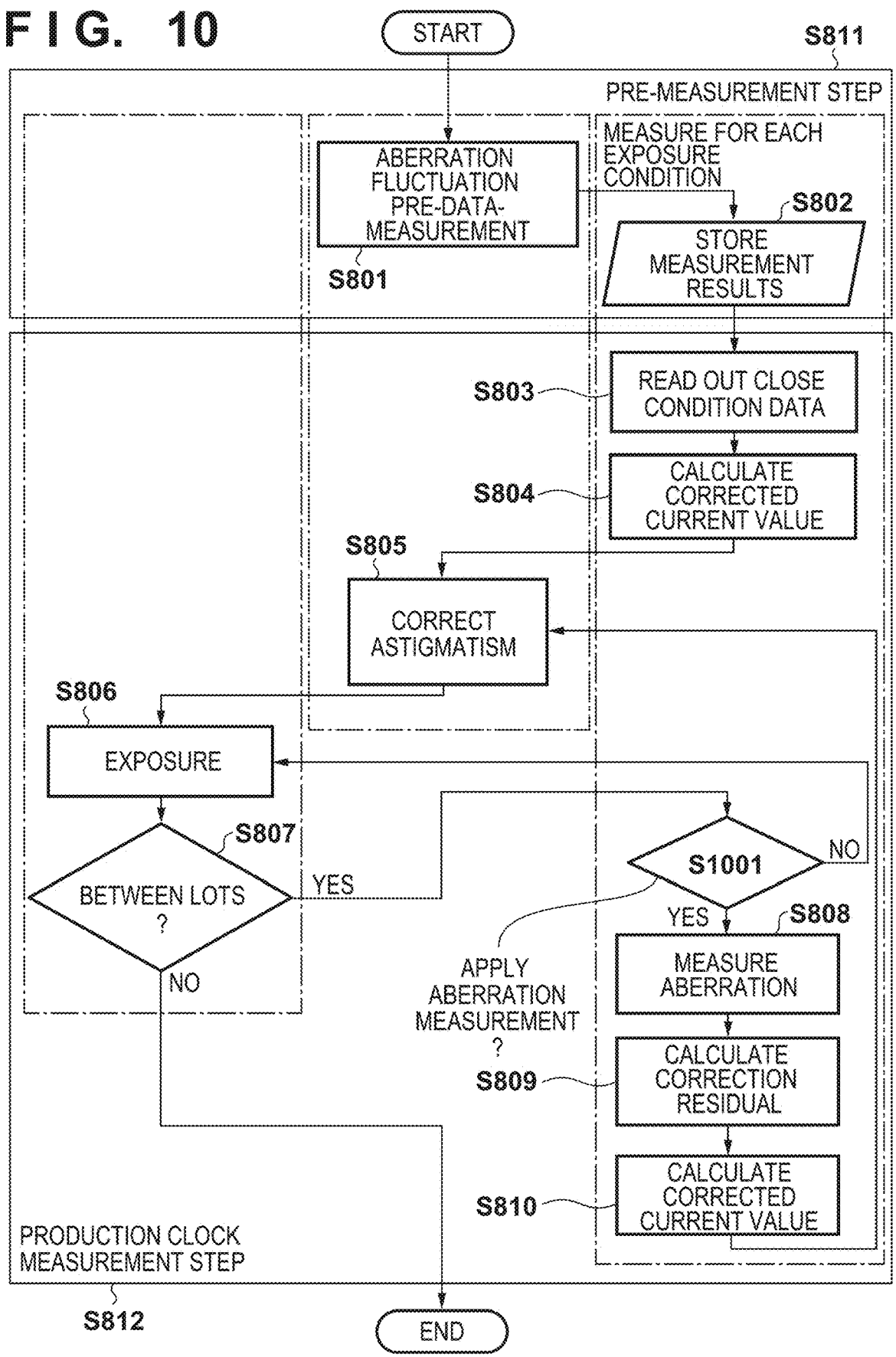
FIG. 10 is a flowchart illustrating the astigmatism correction processing in a modification.

FIG. 10 shows a modification of the flowchart of FIG. 8. In this modification, the execution timing of the next aberration measurement is adjusted based on the comparison between the aberration measured in the pre-measurement step and the aberration measured in the aberration measurement (the third step) in the past non-exposure period. In FIG. 10, step S1001 is added in which, if it is determined in step S807 that there is a next lot, whether to execute the astigmatism characteristic measurement (the third step) in step S808 is determined.

For example, in step S1001, the controller 100 compares the difference (referred to as an "aberration fluctuation" hereinafter) between the characteristic data acquired in step S803 and the characteristic data obtained in step S808, which has been calculated in step S809 in the immediately preceding non-exposure period, with a predetermined allowable value. If the aberration fluctuation exceeds the allowable value, the process advances to step S808. If the aberration variation does not exceed the allowable value, the process does not advance to step S808 but advances to step S806 to perform the next exposure operation. Thus, the correction residuals can be canceled only when necessary, so that a decrease in throughput can be minimized.

Note that in step S1001, whether to execute the astigmatism characteristic measurement may be determined using the aberration fluctuations in a plurality of past non-exposure periods. For example, step S808 may be executed if the average value of aberration fluctuations in a plurality of past non-exposure periods exceeds an allowable value. Alternatively, step S808 may be executed if the change rate of the aberration variations in a plurality of past non-exposure periods exceeds a threshold value.

Figure 9:
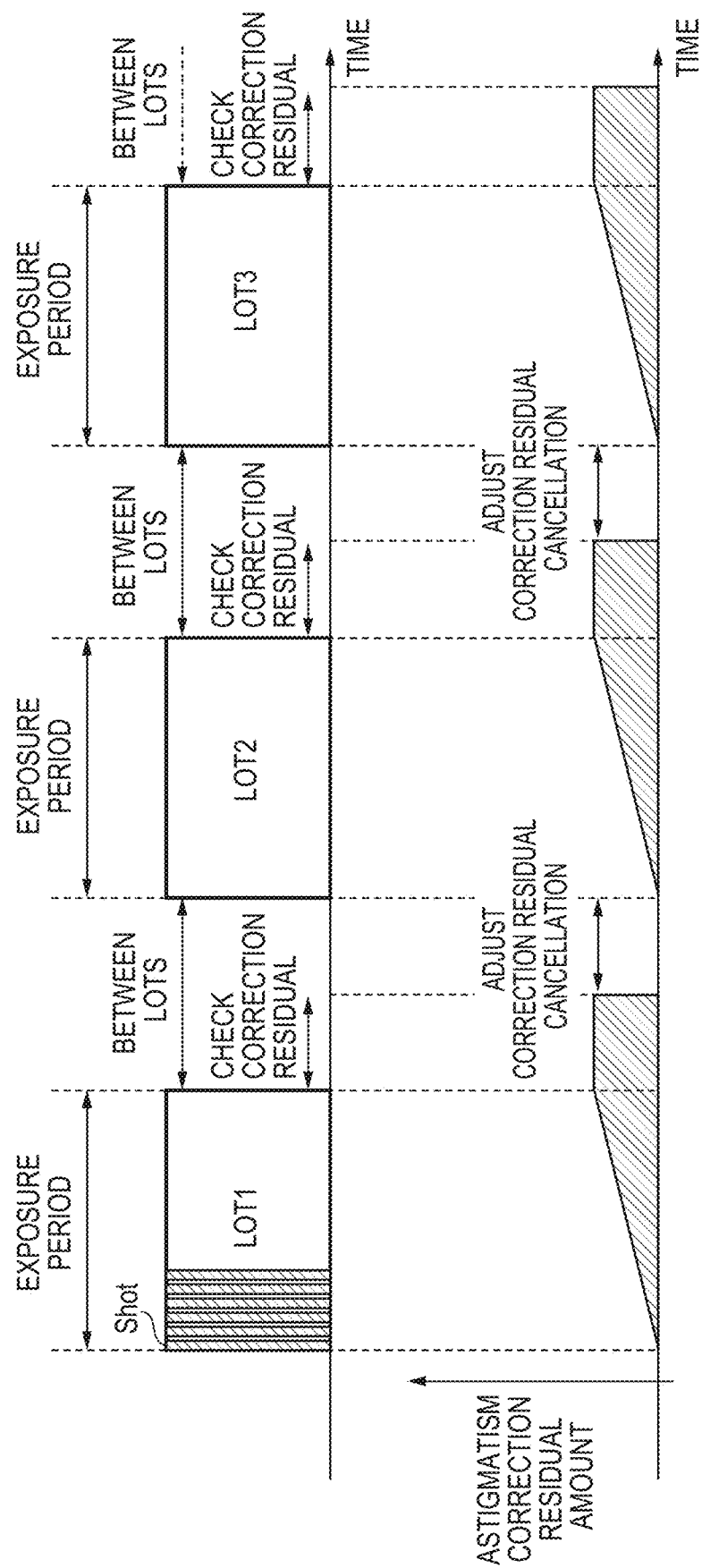
FIG. 9 is a view for explaining the effect of the astigmatism correction processing in the embodiment.

According to the embodiment described above, the astigmatism correction residuals are canceled in the non-exposure period. Therefore, as shown in FIG. 9, an increase in correction residual accumulated amount along with a long-term operation is suppressed, so that it is possible to maintain the high correction accuracy of the projection optical system for a long period of time.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-170804, filed Sep. 19, 2019, which is hereby incorporated by reference herein in its entirety.

What is claimed is:

1. An exposure method of performing an exposure operation of exposing a substrate via a projection optical system, the method comprising:
   executing, in an exposure period in which the exposure operation is performed, aberration correction of the projection optical system using a predetermined correction amount determined in advance based on aberration fluctuation characteristics of the projection optical system, to correct an aberration generated by performing the exposure operation;

measuring, in a non-exposure period succeeding the exposure period, in which the exposure operation is not performed, an aberration of the projection optical system while correcting the aberration of the projection optical system using the predetermined correction amount in a non-exposure period; and correcting the aberration of the projection optical system using a correction amount changed from the predetermined correction amount based on a result of the measurement so as to reduce a correction residual in the aberration correction of the projection optical system, wherein the correction residual is an aberration that remains even after the aberration of the projection optical system is corrected using the predetermined correction amount.

2. The method according to claim 1, further comprising measuring an aberration of the projection optical system before the exposure period.

3. The method according to claim 2, wherein
the measuring the aberration before the exposure period includes measuring the aberration of the projection optical system generated under each of a plurality of exposure conditions, and
the aberration correction in the exposure period includes determining the correction amount from a result of the measurement of the aberration executed before the exposure period under an exposure condition selected from the plurality of exposure conditions based on an exposure condition applied to the exposure operation.

4. The method according to claim 2, wherein an execution timing of the measurement in the non-exposure period is adjusted based on a comparison between an aberration obtained by the measurement before the exposure period and an aberration obtained by measurement in a past non-exposure period.

5. The method according to claim 4, wherein if a difference between the aberration obtained by the measurement before the exposure period and the aberration obtained by the measurement in the past non-exposure period exceeds an allowable value, the measurement in the non-exposure period is executed.

6. The method according to claim 4, wherein if an average of the differences between the aberration obtained by the measurement before the exposure period and the aberrations obtained by measurements in a plurality of past non-exposure periods exceeds an allowable value, the measurement in the non-exposure period is executed.

7. The method according to claim 4, wherein if a change rate of the differences between the aberration obtained by the measurement before the exposure period and the aberrations obtained by measurements in a plurality of past non-exposure periods exceeds a threshold value, the measurement in the non-exposure period is executed.

8. The method according to claim 1, wherein the aberration correction in the exposure period is executed by controlling a temperature distribution on an optical element of the projection optical system.

9. An exposure apparatus that performs an exposure operation of exposing a substrate via a projection optical system, wherein the apparatus executes, in an exposure period in which the exposure operation is performed, aberration correction of the projection optical system using a predetermined correction amount determined in advance based on aberration fluctuation characteristics of the projection optical system, to correct an aberration generated by performing the exposure operation, and corrects an aberration of the projection optical system using a correction amount changed from the predetermined correction amount based on a measurement result of an aberration of the projection optical system in a non-exposure period succeeding the exposure period, in which the exposure operation is not performed, so as to reduce a correction residual in the aberration correction, wherein the measurement is performed while correcting the aberration of the projection optical system using the predetermined correction amount in the non-exposure period, wherein the correction residual is an aberration that remains even after the aberration of the projection optical system is corrected using the predetermined correction amount.

10. An article manufacturing method comprising:
exposing a substrate using an exposure method defined in claim 1;
developing the exposed substrate; and
processing the developed substrate,
wherein an article is manufactured from the processed substrate.

11. An article manufacturing method comprising:
exposing a substrate using an exposure apparatus defined in claim 9;
developing the exposed substrate; and
processing the developed substrate,
wherein an article is manufactured from the processed substrate.

12. A manufacturing method of a semiconductor device, the method comprising:
exposing a substrate via a projection optical system; and
developing the exposed substrate,
wherein the exposing includes:
executing, in an exposure period in which an exposure operation is performed, aberration correction of the projection optical system using a predetermined correction amount determined in advance based on aberration fluctuation characteristics of the projection optical system, to correct an aberration generated by performing the exposure operation;
measuring, in a non-exposure period succeeding the exposure period, in which the exposure operation is not performed, an aberration of the projection optical system while correcting the aberration of the projection optical system using the predetermined correction amount in a non-exposure period; and
correcting the aberration of the projection optical system using a correction amount changed from the predetermined correction amount based on a result of the measurement so as to reduce a correction residual in the aberration correction of the projection optical system, wherein the correction residual is an aberration that remains even after the aberration of the projection optical system is corrected using the predetermined correction amount.

* * * * *